(12) United States Patent
Zardoni et al.

(10) Patent No.: US 11,499,245 B2
(45) Date of Patent: Nov. 15, 2022

(54) ADDITIVE FEED SYSTEMS, INGOT PULLER APPARATUS AND METHODS FOR FORMING A SINGLE CRYSTAL SILICON INGOT WITH USE OF SUCH ADDITIVE FEED SYSTEMS

(71) Applicant: GlobalWafers Co., Ltd., Hsinchu (TW)

(72) Inventors: Marco Zardoni, Merano (IT); Giancarlo Zago, Merano (IT); Giorgio Agostini, San Giacomo di Laives (IT); Stephan Haringer, Ciardes (IT); James Eoff, Montgomery City, MO (US)

(73) Assignee: GLOBALWAFERS CO., LTD., Hsinchu (TW)

( * ) Notice: Subject to any disclaimer, the term of this patent is extended or adjusted under 35 U.S.C. 154(b) by 0 days.

(21) Appl. No.: 17/138,035

(22) Filed: Dec. 30, 2020

(65) Prior Publication Data
US 2022/0205130 A1  Jun. 30, 2022

(51) Int. Cl.
*C30B 15/04* (2006.01)
*C30B 29/06* (2006.01)
*C30B 15/20* (2006.01)

(52) U.S. Cl.
CPC .............. *C30B 15/04* (2013.01); *C30B 15/20* (2013.01); *C30B 29/06* (2013.01)

(58) Field of Classification Search
CPC ......... C30B 29/06; C30B 15/04; C30B 15/02; C30B 15/20; Y10T 117/1056
See application file for complete search history.

(56) References Cited

U.S. PATENT DOCUMENTS

| | | | |
|---|---|---|---|
| 5,037,503 A * | 8/1991 | Kajimoto | C30B 15/02 423/349 |
| 5,462,010 A | 10/1995 | Takano et al. | |
| 10,273,596 B2 | 4/2019 | Yun et al. | |
| 2010/0294999 A1 | 11/2010 | Narushima et al. | |
| 2012/0228581 A1* | 9/2012 | Hwang | B82Y 20/00 257/E33.034 |
| 2012/0301386 A1 | 11/2012 | Johnson et al. | |
| 2015/0259821 A1* | 9/2015 | Kwon | C30B 15/12 117/214 |
| 2015/0259824 A1* | 9/2015 | Kwon | C30B 15/305 117/214 |
| 2017/0247809 A1* | 8/2017 | Haringer | C30B 15/14 |

FOREIGN PATENT DOCUMENTS

| | | |
|---|---|---|
| JP | S6327480 U | 2/1988 |
| JP | H03271188 A | 12/1991 |
| KR | 101093925 B1 | 12/2011 |

OTHER PUBLICATIONS

International Search Report and Written Opinion for International Application No. PCT/US2021/065469, 14 pages, dated Apr. 12, 2022.

* cited by examiner

*Primary Examiner* — Robert M Kunemund
(74) *Attorney, Agent, or Firm* — Armstrong Teasdale LLP

(57) ABSTRACT

Additive feed systems for feeding at least two different additives to silicon disposed within a crucible of an ingot puller apparatus are disclosed. The additive feed system may include first and second feed trays which are caused to vibrate to move first or second additive from a canister in which the additive is stored to another vessel in which the amount of first or second additive added to the vessel is sensed. The additive is discharged from the vessel into an additive feed tube through which the additive enters the crucible.

19 Claims, 10 Drawing Sheets

ADDITIVE FEED SYSTEMS, INGOT PULLER APPARATUS AND METHODS FOR FORMING A SINGLE CRYSTAL SILICON INGOT WITH USE OF SUCH ADDITIVE FEED SYSTEMS

FIELD OF THE DISCLOSURE

The field of the disclosure relates to additive feed systems for feeding at least two different additives to silicon disposed within a crucible of an ingot puller apparatus.

BACKGROUND

During growth of single crystal silicon ingots by the Czochralski process, various additives may be added to the crucible before or after ingot growth. As customer specifications and ingot quality parameters have evolved, different types of additives may be added to the crucible during an ingot cycle to improve and/or more precisely control ingot quality parameters. For example, it may be desirable to add both dopant and quartz cullets to the crucible. Dopants vary the resistivity profile of the melt and cullets may act as buffer members which float in the melt and contact polysilicon which is added to the melt during ingot growth (e.g., as in continuous Czochralski growth process).

A need exists for additive feed systems which are capable of adding two different additives from different feed containers with relative precision and with shared components to minimize cost and the footprint of the additive feed system.

This section is intended to introduce the reader to various aspects of art that may be related to various aspects of the disclosure, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

SUMMARY

One aspect of the present disclosure is directed to an additive feed system for feeding at least two different additives to silicon disposed within a crucible. The additive feed system includes a first canister for holding a first additive and a second canister for holding a second additive. A vessel collects first additive discharged from the first canister and second additive discharged from the second canister. An additive sensor senses an amount of first additive or second additive in the vessel. An additive feed tube transports first additive or second additive from the vessel to the crucible.

Another aspect of the present disclosure is directed to an ingot puller apparatus for preparing a silicon ingot. The ingot puller apparatus includes a crucible for holding a silicon melt and a growth chamber for pulling a silicon ingot from the melt. The crucible is disposed within the crucible. The apparatus includes an additive feed system for feeding at least two different additives to silicon disposed within the crucible. The additive feed system includes a first canister for holding a first additive and a second canister for holding a second additive. The additive feed system includes a vessel for collecting first additive discharged from the first canister and second additive discharged from the second canister. The additive feed system includes an additive feed tube for transporting first additive or second additive from the vessel to the crucible.

Yet a further aspect of the present disclosure is directed a method for forming a single crystal silicon ingot. Solid-phase polycrystalline silicon is added to a crucible having a sidewall and a bottom. The polycrystalline silicon is heated to form a silicon melt having a surface. The silicon melt is contacted with a seed crystal. The seed crystal is withdrawn from the silicon melt to form a silicon ingot. A first additive is added to a vessel. An amount of first additive is weighed in the vessel. The first additive is added to the melt when the amount of first additive in the vessel equals or exceeds a target first additive amount. A second additive is added to the vessel. An amount of second additive is weighed in the vessel. The second additive is added to the melt when the amount of second additive in the vessel equals or exceeds a target second additive amount.

Various refinements exist of the features noted in relation to the above-mentioned aspects of the present disclosure. Further features may also be incorporated in the above-mentioned aspects of the present disclosure as well. These refinements and additional features may exist individually or in any combination. For instance, various features discussed below in relation to any of the illustrated embodiments of the present disclosure may be incorporated into any of the above-described aspects of the present disclosure, alone or in any combination.

BRIEF DESCRIPTION OF THE DRAWINGS

Corresponding reference characters indicate corresponding parts throughout the drawings.

DETAILED DESCRIPTION

Figure 1:
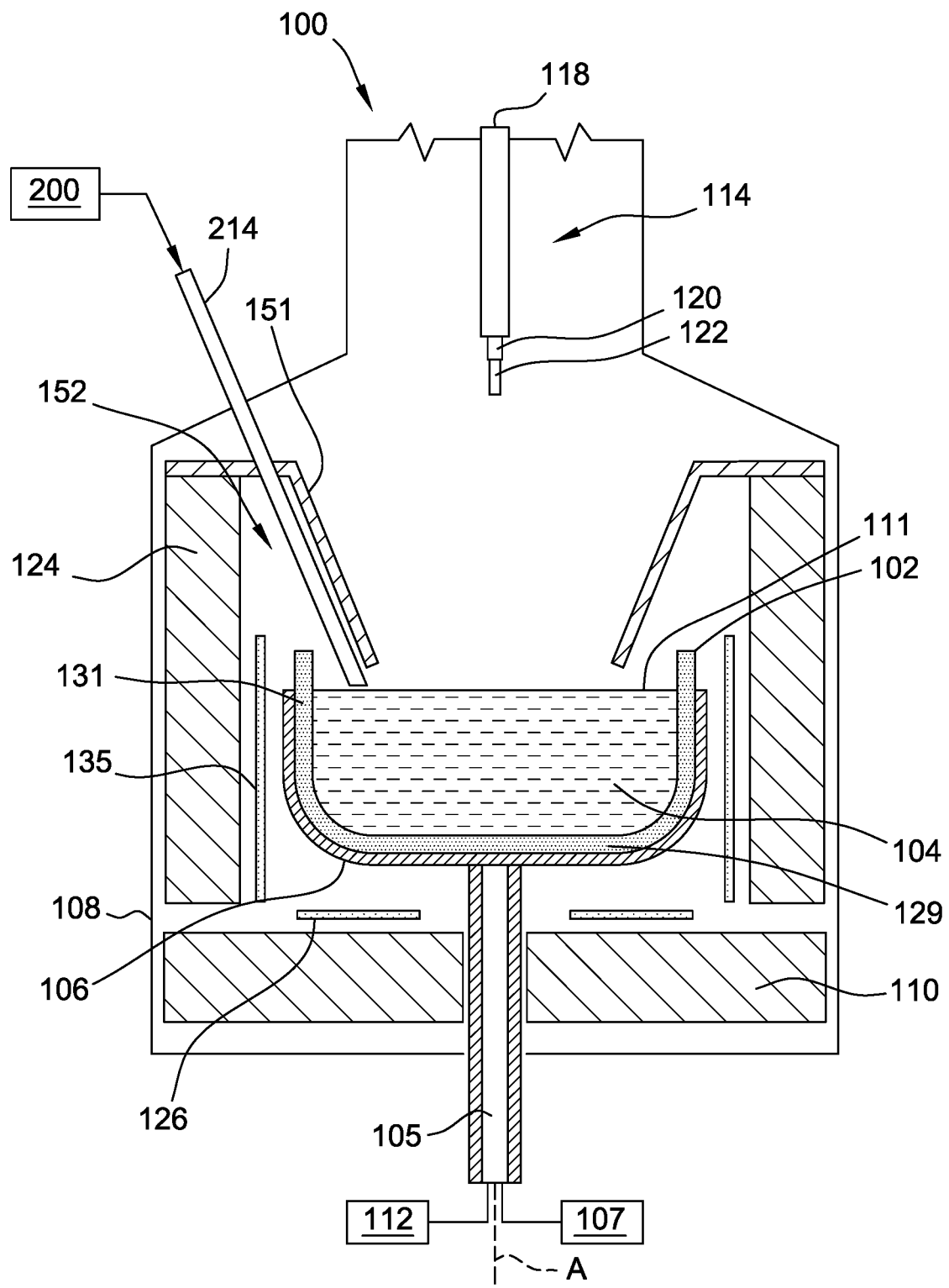
FIG. 1 is a cross-section of an ingot puller apparatus before silicon ingot growth.

Provisions of the present disclosure relate to additive feed systems for feeding at least two different additives to silicon disposed within a crucible of an ingot puller apparatus and to methods for forming a crystal silicon ingot with use of such additive feed systems. Generally the additive feed system may be used with any ingot puller apparatus that is configured to pull a single crystal silicon ingot. An example ingot puller apparatus (or more simply "ingot puller") is indicated generally at "100" in FIG. 1. The ingot puller apparatus 100 includes a crucible 102 for holding a melt 104 of semiconductor or solar-grade material, such as silicon, supported by a susceptor 106. The ingot puller apparatus 100 includes a crystal puller housing 108 that defines a growth chamber 152 for pulling a silicon ingot 113 (FIG. 2) from the melt 104 along a pull axis A.

The crucible 102 includes a floor 129 and a sidewall 131 that extends upward from the floor 129. The sidewall 131 is generally vertical. Within the crucible 102 is a silicon melt 104 having a melt surface 111 (i.e., melt-ingot interface). In some embodiments, the crucible 102 is layered. For example, the crucible 102 may be made of a quartz base layer and a synthetic quartz liner disposed on the quartz base layer.

The susceptor 106 is supported by a shaft 105. The susceptor 106, crucible 102, shaft 105 and ingot 113 (FIG. 2) have a common longitudinal axis A or "pull axis" A.

A pulling mechanism 114 (FIG. 2) is provided within the ingot puller apparatus 100 for growing and pulling an ingot 113 from the melt 104. Pulling mechanism 114 includes a pulling cable 118, a seed holder or chuck 120 coupled to one end of the pulling cable 118, and a seed crystal 122 coupled to the seed holder or chuck 120 for initiating crystal growth. One end of the pulling cable 118 is connected to a pulley (not shown) or a drum (not shown), or any other suitable type of lifting mechanism, for example, a shaft, and the other end is connected to the chuck 120 that holds the seed crystal 122. In operation, the seed crystal 122 is lowered to contact the melt 104. The pulling mechanism 114 is operated to cause the seed crystal 122 to rise. This causes a single crystal ingot 113 (FIG. 2) to be pulled from the melt 104.

Figure 2:
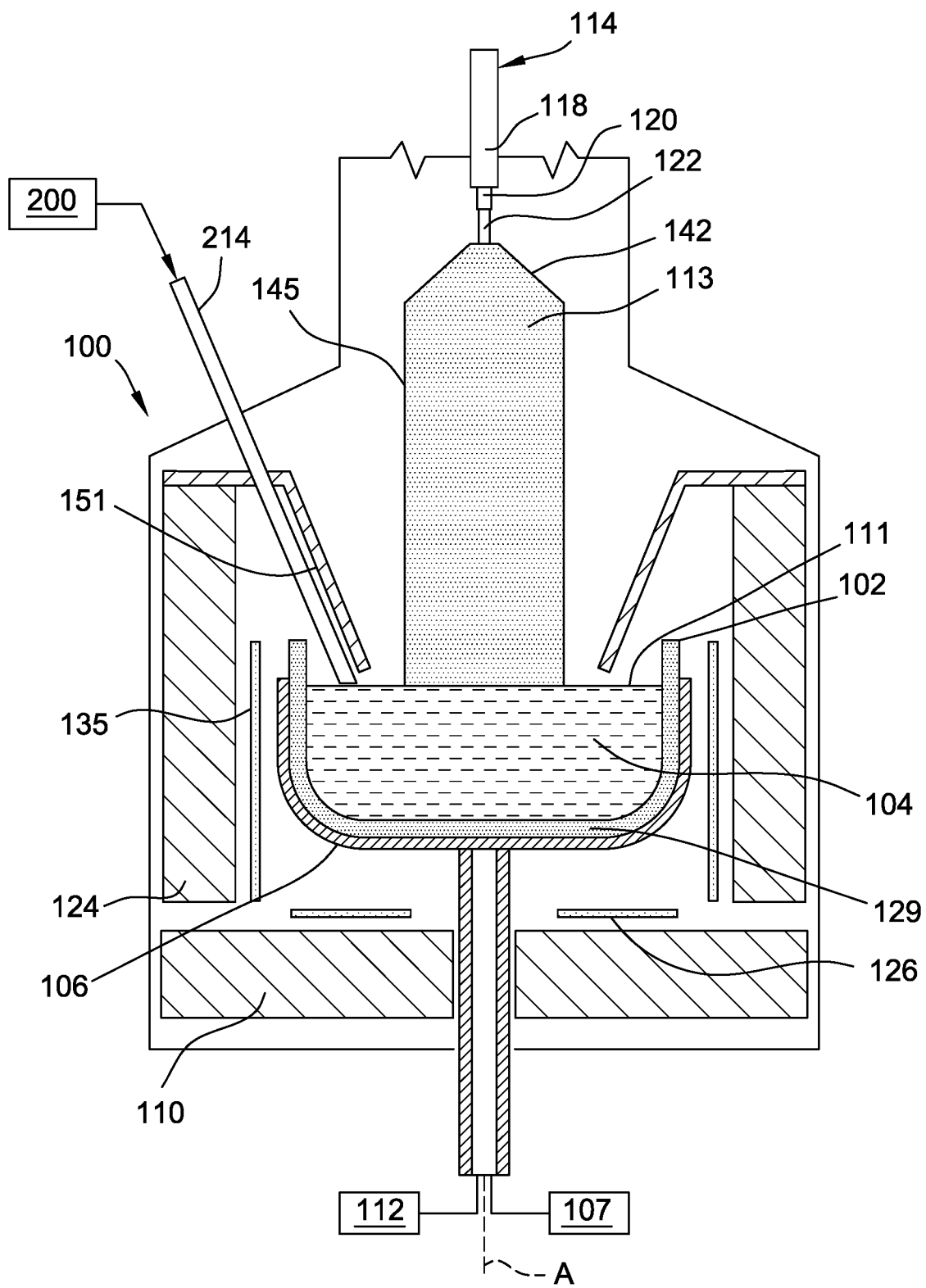
FIG. 2 is a cross-section of the ingot puller apparatus during silicon ingot growth.

During heating and crystal pulling, a crucible drive unit 107 (e.g., a motor) rotates the crucible 102 and susceptor 106. A lift mechanism 112 raises and lowers the crucible 102 along the pull axis A during the growth process. For example, the crucible 102 may be at a lowest position (near the bottom heater 126) in which a charge of solid-phase polycrystalline silicon previously added to the crucible 102 is melted. Crystal growth commences by contacting the melt 104 with the seed crystal 122 and lifting the seed crystal 122 by the pulling mechanism 114. As the ingot 113 grows, the silicon melt 104 is consumed and the height of the melt in the crucible 102 decreases. The crucible 102 and susceptor 106 may be raised to maintain the melt surface 111 at or near the same position relative to the ingot puller apparatus 100 (FIG. 2).

A crystal drive unit (not shown) may also rotate the pulling cable 118 and ingot 113 (FIG. 2) in a direction opposite the direction in which the crucible drive unit 107 rotates the crucible 102 (e.g., counter-rotation). In embodiments using iso-rotation, the crystal drive unit may rotate the pulling cable 118 in the same direction in which crucible drive unit 107 rotates the crucible 102.

According to the Czochralski single crystal growth process, a quantity of solid-phase polycrystalline silicon, or polysilicon, is charged to the crucible 102. The semiconductor or solar-grade material that is introduced into the crucible is melted by heat provided from one or more heating elements. The ingot puller apparatus 100 includes bottom insulation 110 and side insulation 124 to retain heat in the puller apparatus 100. In the illustrated embodiment, the ingot puller apparatus 100 includes a bottom heater 126 disposed below the crucible floor 129. The crucible 102 may be moved to be in relatively close proximity to the bottom heater 126 to melt the polycrystalline charged to the crucible 102.

To form the ingot, the seed crystal 122 is contacted with the surface 111 of the melt 104. The pulling mechanism 114 is operated to pull the seed crystal 122 from the melt 104.

Referring now to FIG. 2, the ingot 113 includes a crown portion 142 in which the ingot transitions and tapers outward from the seed crystal 122 to reach a target diameter. The ingot 113 includes a constant diameter portion 145 or cylindrical "main body" of the crystal which is grown by increasing the pull rate. The main body 145 of the ingot 113 has a relatively constant diameter. The ingot 113 includes a tail or end-cone (not shown) in which the ingot tapers in diameter after the main body 145. When the diameter becomes small enough, the ingot 113 is then separated from the melt 104.

The ingot puller apparatus 100 includes a side heater 135 and a susceptor 106 that encircles the crucible 102 to maintain the temperature of the melt 104 during crystal growth. The side heater 135 is disposed radially outward to the crucible sidewall 131 as the crucible 102 travels up and down the pull axis A. The side heater 135 and bottom heater 126 may be any type of heater that allows the side heater 135 and bottom heater 126 to operate as described herein. In some embodiments, the heaters 135, 126 are resistance heaters. The side heater 135 and bottom heater 126 may be controlled by a control system (not shown) so that the temperature of the melt 104 is controlled throughout the pulling process.

The ingot puller apparatus 100 may include a heat shield 151. The heat shield 151 may shroud the ingot 113 and may be disposed within the crucible 102 during crystal growth (FIG. 2). The ingot puller apparatus 100 may include an inert gas system to introduce and withdraw an inert gas such as argon from the growth chamber 152.

Figure 3:
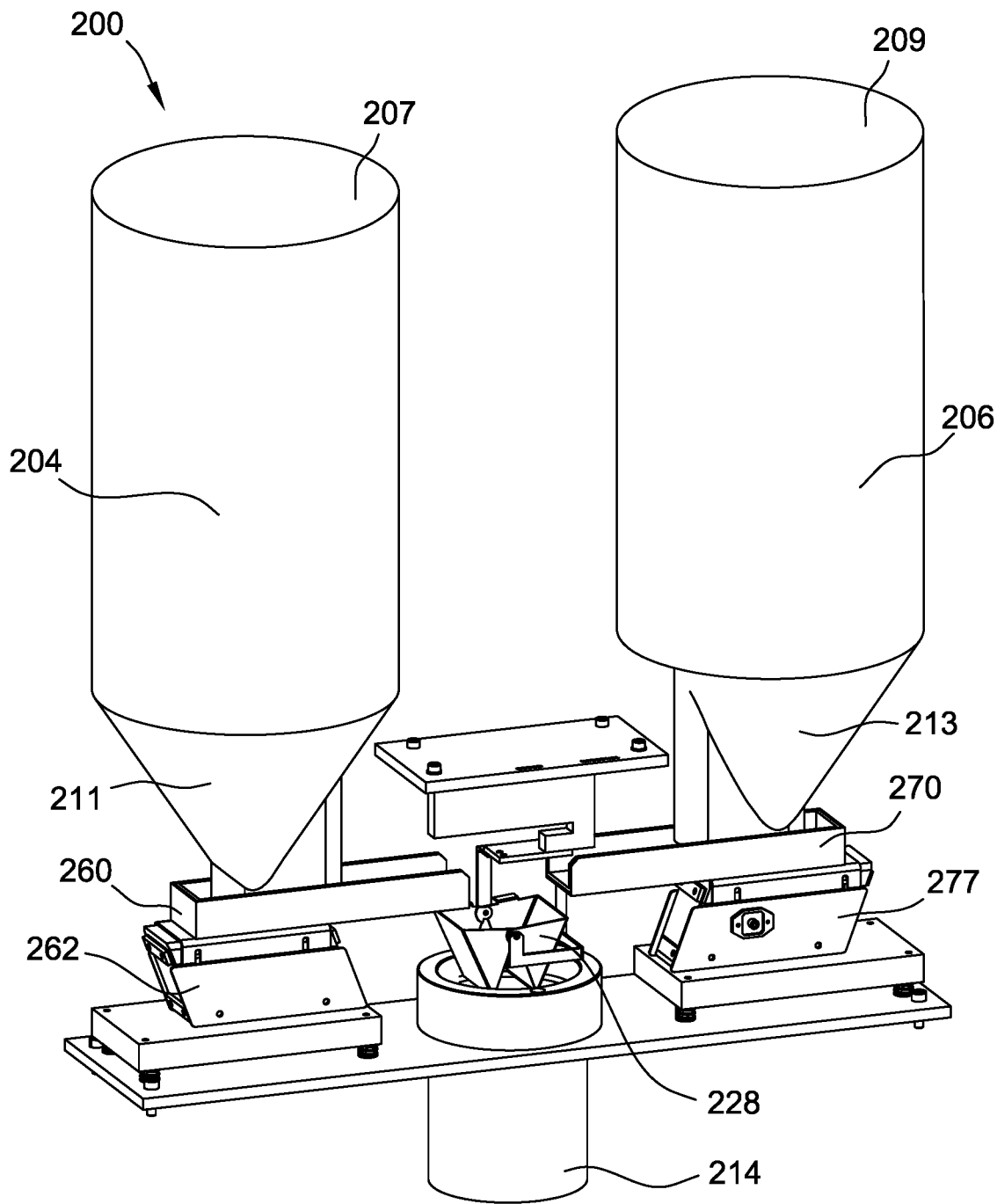
FIG. 3 is a perspective view of an additive feed system of the ingot puller apparatus.

In accordance with embodiments of the present disclosure, the ingot puller apparatus 100 also includes an additive feed system 200 for introducing additive into the melt 104 such as through additive feed tube 214. Referring now to FIG. 3, an example additive feed system 200 of the present disclosure is shown. The additive feed system 200 is configured to add two different additives to silicon disposed within a crucible 102 (FIG. 1). The additive feed system 200 may be adapted to add more than two additives (e.g., with additional additive canisters, trays, vibrators, and the like).

The additive feed system 200 includes a first canister 204 for holding a first additive (not shown) and a second canister 206 for holding a second additive. The first and second canisters 204, 206 each include a removable lid 207, 209 for sealing the canister 204, 206. The first and second canisters 204, 206 each also include funnel portions 211, 213 which direct additive to trays 260, 270 disposed below the canisters 204, 206. The system 200 may be mounted to the ingot puller apparatus 100 by connecting the additive feed tube 214 to a viewport (not shown) of the ingot puller apparatus 100.

Figure 6:
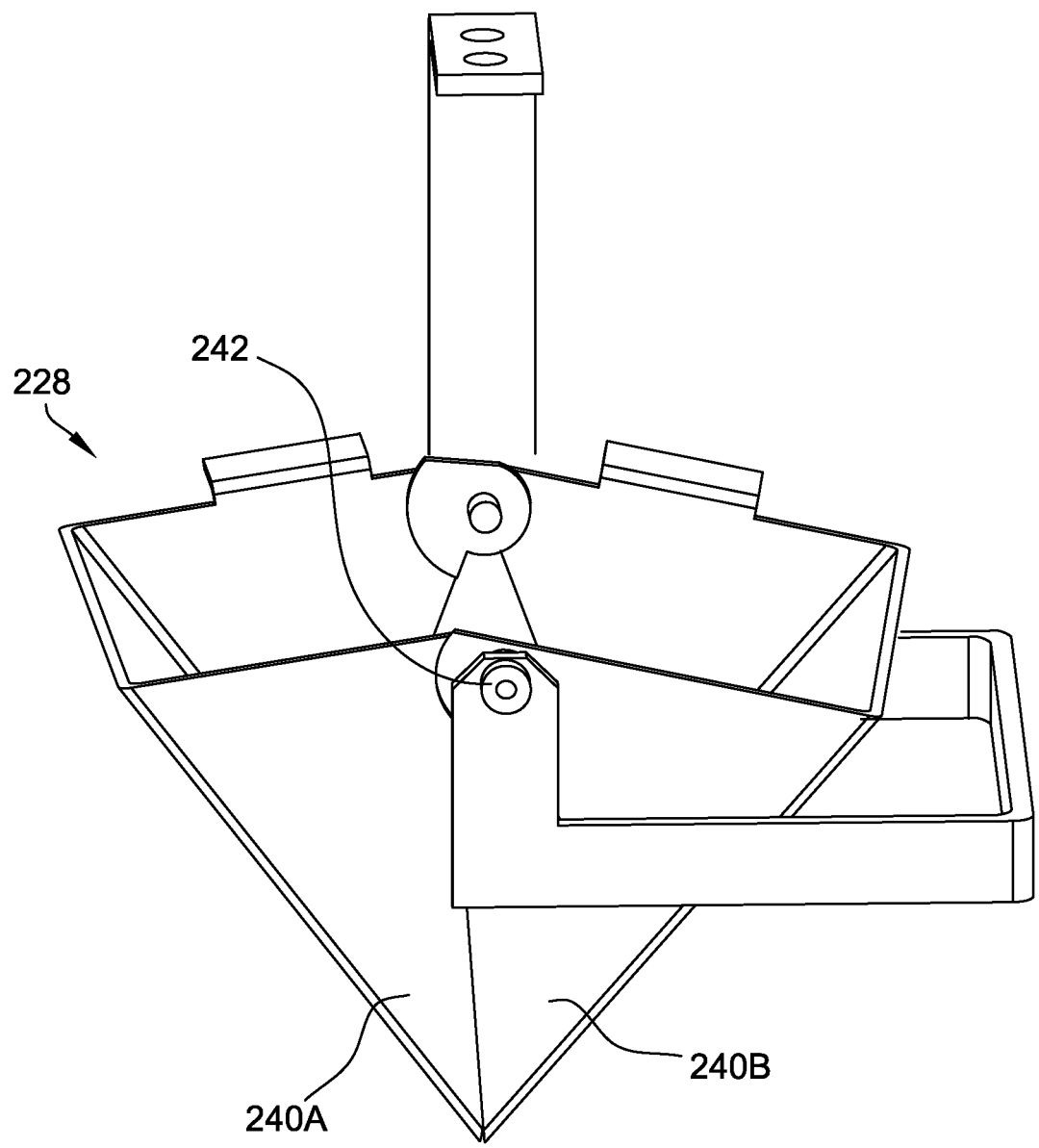
FIG. 6 is a perspective view of the vessel in the closed position.
Figure 7:
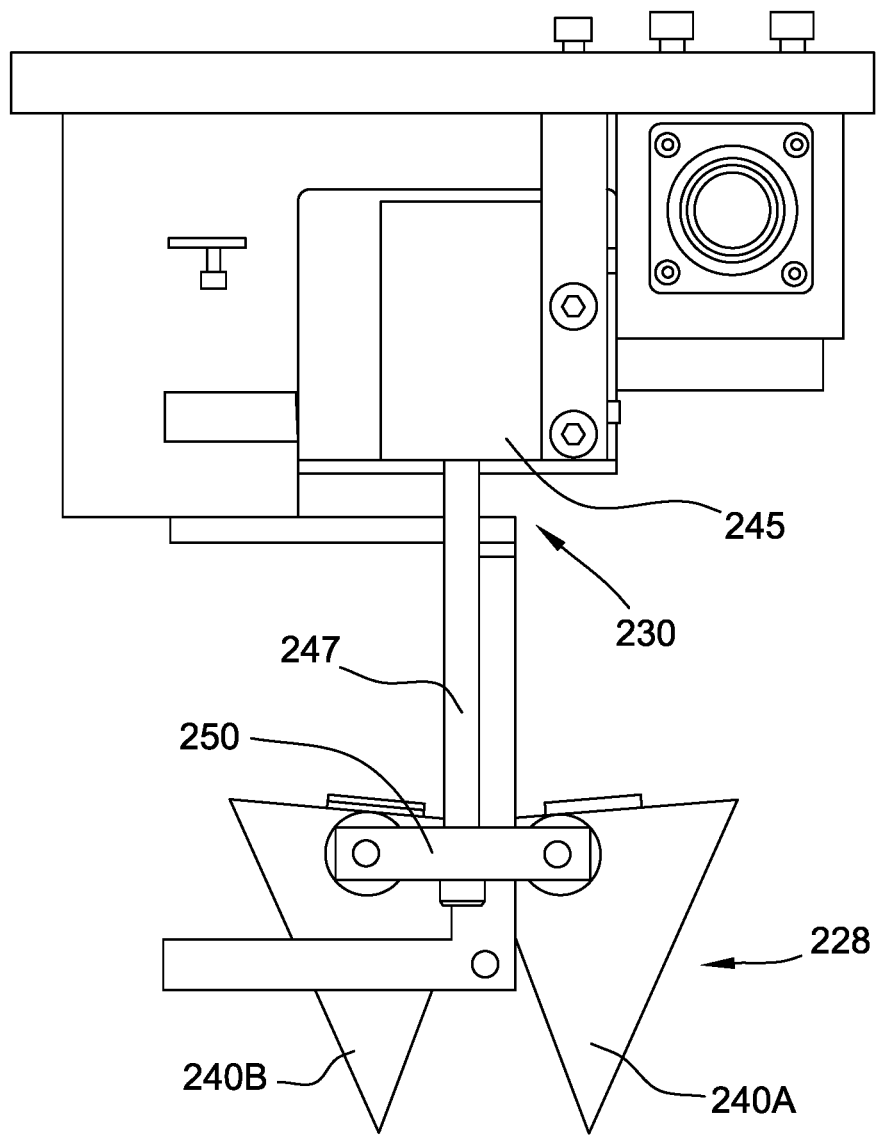
FIG. 7 is a rear view of the vessel and an actuator for opening and closing the vessel.

The system 200 includes a vessel 228 for collecting first additive discharged from the first canister 204 and second additive discharged from the second canister 206. The vessel 228 is shown in an "open" position in which additive is discharged from the vessel. As described further below, the vessel 228 may be moved to a "closed" position (FIG. 6) in which additive may collect in the vessel 228. Once the amount of additive in the vessel 228 is measured (i.e., a set point reached), an actuator 230 (FIG. 7) is activated and the additive is discharged from the vessel 228 into an additive feed tube 214. The first additive or second additive flows through the additive feed tube 214 and into the crucible 102 (FIG. 1). The additive feed tube 214 may include an outer housing (not shown) that forms seals with the first and second canisters 204, 206 and with the additive feed tube 214 to isolate the growth chamber 152 (FIG. 1) of the ingot puller apparatus 100 with the surrounding ambient.

An additive sensor 231 (FIG. 5) senses the amount of first additive or second additive added to the vessel 228 (i.e., the batch of first or second additive added to the vessel 228). In the illustrated embodiment, the additive sensor 231 is a load cell which weighs the batch of additive added to the vessel 228. In other embodiments, the additive sensor 231 is a flow meter or pressure transducer.

Generally any vessel 228 and actuator 230 that enables additive to be collected in the vessel 228 and for additive to be discharged into the additive feed tube 214 may be used unless stated otherwise. The illustrated vessel 228 (FIG. 6) includes a first and second jaw segments 240A, 240B that pivot about a pin 242 to open and close the vessel 228. A motor 245 (FIG. 7) (e.g., electromagnetic coil) moves a rod 247 vertically. The rod 247 is connected to a bracket 250 which is connected to each jaw segment 240A, 240B of the vessel 228.

As the bracket 250 moves vertically, the jaw segments 240A, 240B are caused to pivot toward each other or away from each other to allow the vessel 228 to open and close. When the motor 245 is not powered, the weight of the jaw segments 240A, 240B pulls the rod 247 and bracket 250 down causing the jaws 240A, 240B to move toward each other and close the vessel 228. When the motor 245 is powered, the motor 245 pulls the rod 247 and bracket 250 upward causing the jaw segments 240A, 240B to move away from each other to open the vessel 228.

Figure 4:
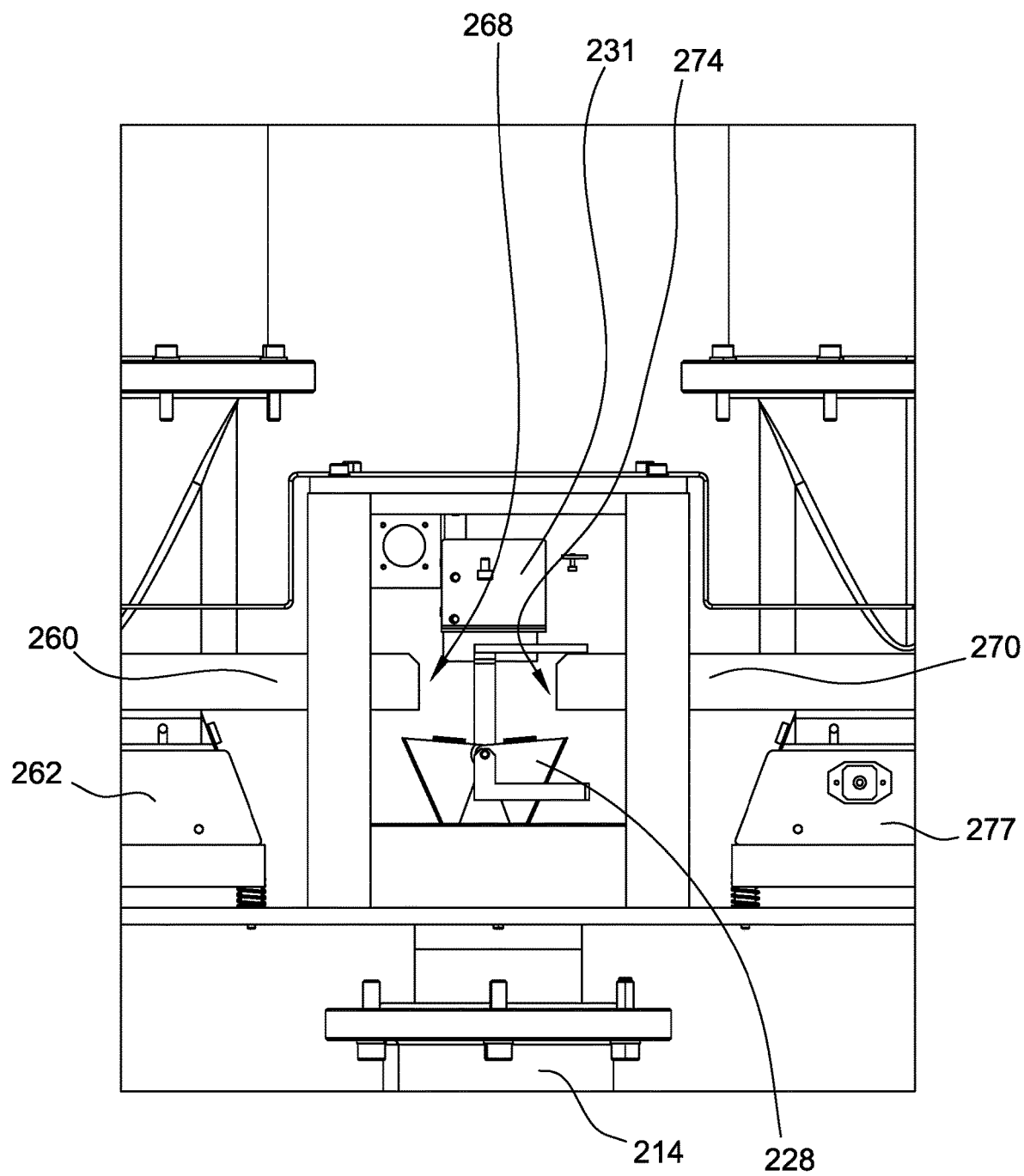
FIG. 4 is a detailed front view of the additive feed system with the housing removed.
Figure 5:
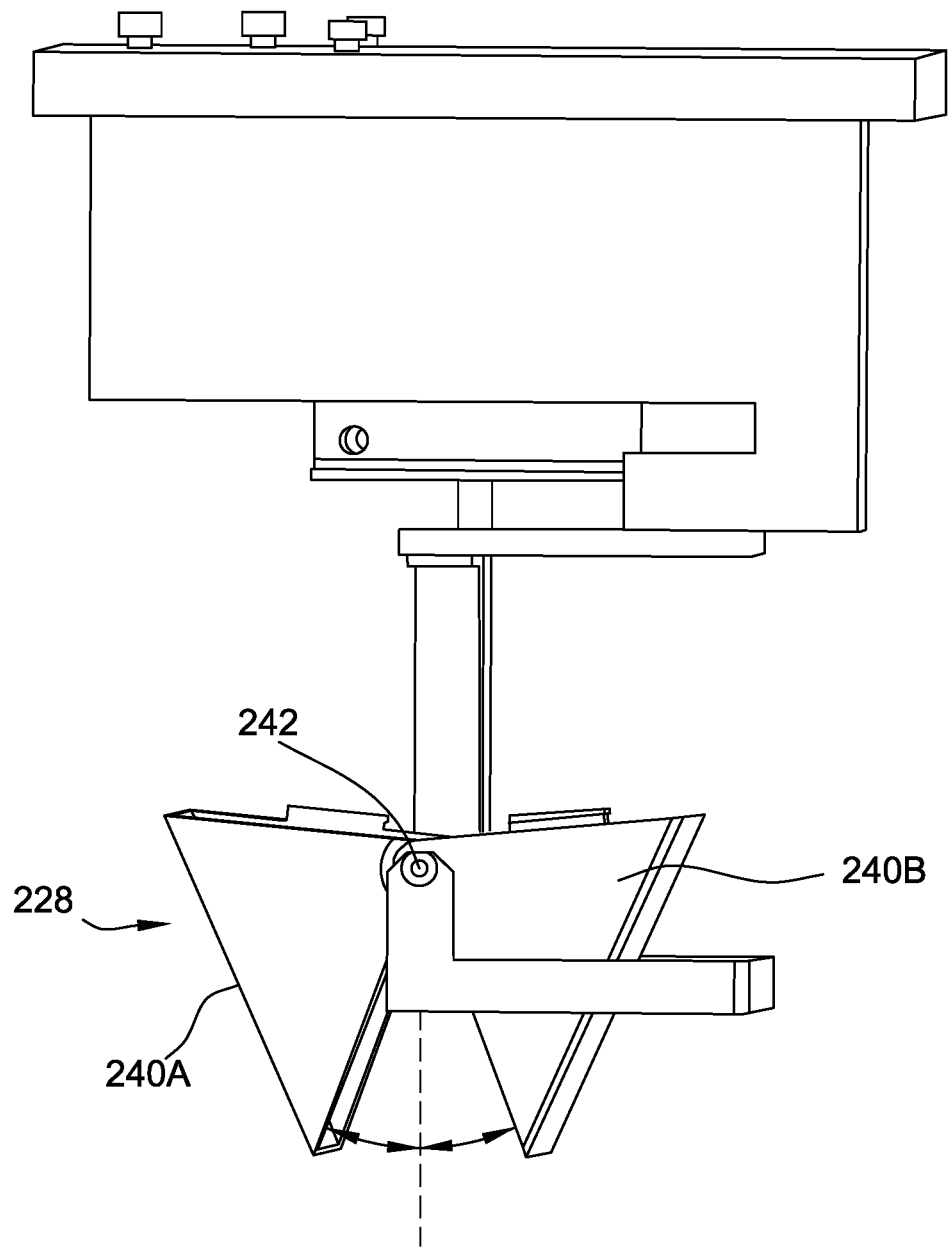
FIG. 5 is a front view of a vessel of the additive feed system with the vessel in the open position.
Figure 8:
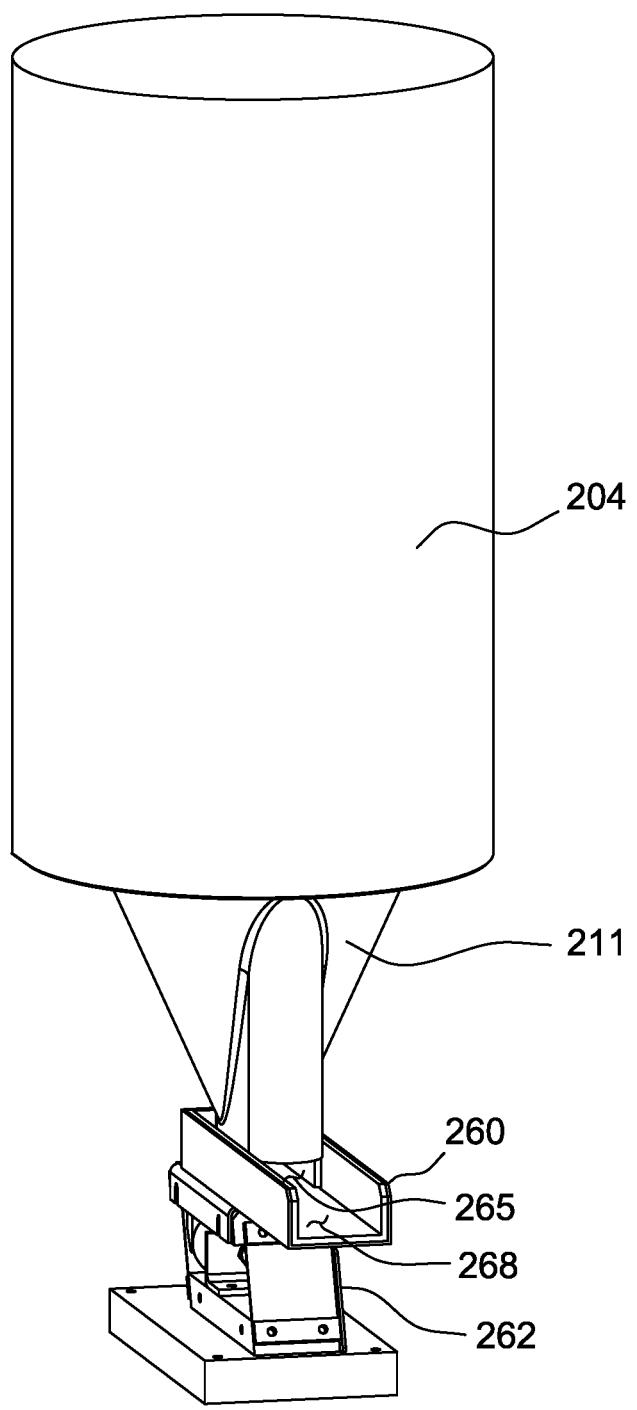
FIG. 8 is a perspective view of a first canister, first tray and first vibrator of the additive feed system.

To move first additive from the first canister 204 to the vessel 228, the additive feed system 200 includes a first tray 260 (FIG. 4) disposed below the first canister 204 that extends between the canister 204 and the vessel 228. A first canister outlet 265 (FIG. 8) is disposed within the first tray 260. The first tray 260 has a first tray outlet 268 that is disposed above the vessel 228 (FIG. 5). The first tray 260 is disposed above and is connected to a first vibrator 262. Powering the vibrator 262 causes the tray 260 to vibrate which conveys first additive from the first canister outlet 265 and across the first tray 260. First additive is discharged from the first tray outlet 268 and into the vessel 228.

Figure 9:
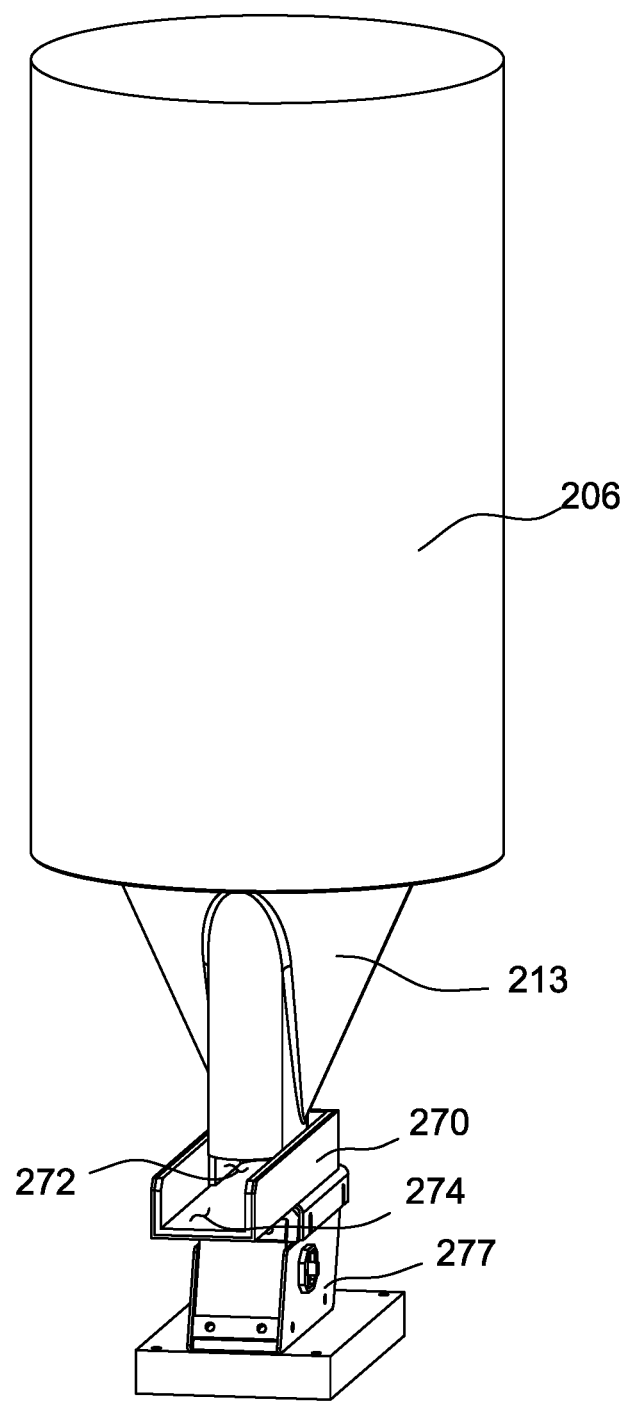
FIG. 9 is a perspective view of a second canister, second tray and second vibrator of the additive feed system.

Referring now to FIG. 9, a second tray 270 is disposed below the second canister 206. A second canister outlet 272 is disposed in the second tray 270. The second tray 270 includes a second tray outlet 274 that is disposed above the vessel 228 (FIG. 5). A second vibrator 277 is disposed below and is connected to the second tray 270. Powering the second vibrator 277 causes the second tray 270 to vibrate which conveys second additive from the second canister outlet 272 and across the second tray 270. Second additive is discharged from the second tray outlet 274 and into the vessel 228.

Figure 10:
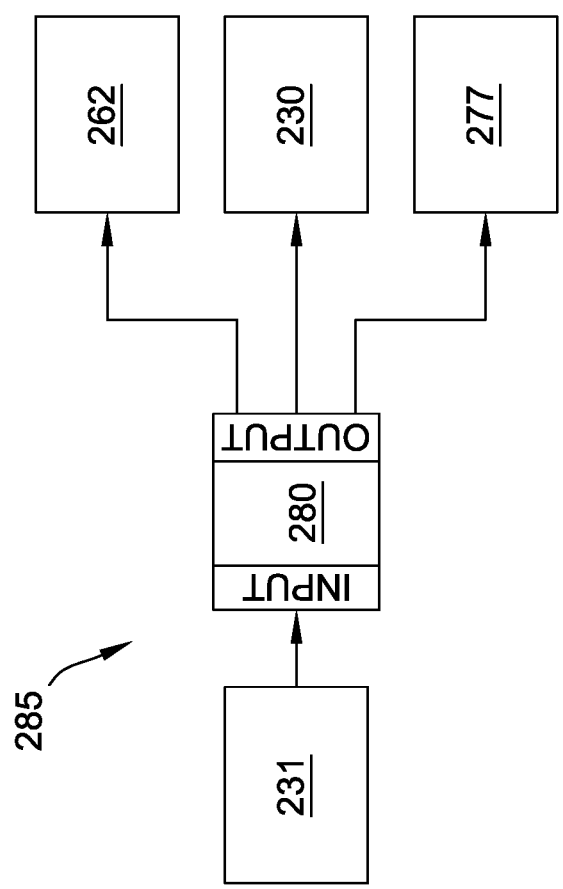
FIG. 10 is a schematic of a control system for controlling the additive feed system.

Referring now to FIG. 10, the additive feed system 200 includes a control system 285 for controlling the additive feed system 200. The control system 285 includes a control unit 280 for controlling the components of the additive feed system 200. For example, the control unit 280 is communicatively connected to the actuator 230 (FIG. 7) (e.g., connected to motor 245) to control opening and closing of the vessel 228. The control unit is also communicatively connected to the first vibrator 262 and the second vibrator 277 to selectively control addition of first and second additive into the vessel 228. The additive sensor 231 sends a signal to the control unit related to the amount of additive in the vessel 228.

Control unit 280, the various logical blocks, modules, and circuits described herein may be implemented or performed with a general purpose computer, a digital signal processor (DSP), an application specific integrated circuit (ASIC), a field programmable gate array (FPGA), or other programmable logic device, discrete gate or transistor logic, discrete hardware components, or any combination thereof designed to perform the functions described herein. Example general purpose processors include, but are not limited to, microprocessors, conventional processors, controllers, microcontrollers, state machines, or a combination of computing devices.

The control unit 280 includes a processor, e.g., a central processing unit (CPU) of a computer for executing instructions. Instructions may be stored in a memory area, for example. Processor may include one or more processing units, e.g., in a multi-core configuration, for executing instructions. The instructions may be executed within a variety of different operating systems on the controller, such as UNIX, LINUX, Microsoft Windows®, etc. It should also be appreciated that upon initiation of a computer-based method, various instructions may be executed during initialization. Some operations may be required in order to perform one or more processes described herein, while other operations may be more general and/or specific to a particular programming language e.g., and without limitation, C, C#, C++, Java, or other suitable programming languages, etc.

Processor may also be operatively coupled to a storage device. Storage device is any computer-operated hardware suitable for storing and/or retrieving data. In some embodiments, storage device is integrated in controller. In other embodiments, storage device is external to controller and is similar to database. For example, the control unit 280 may include one or more hard disk drives as storage device. In other embodiments, storage device is external to controller. For example, storage device may include multiple storage units such as hard disks or solid state disks in a redundant array of inexpensive disks (RAID) configuration. Storage device may include a storage area network (SAN) and/or a network attached storage (NAS) system.

In some embodiments, processor is operatively coupled to storage device via a storage interface. Storage interface is any component capable of providing processor with access to storage device. Storage interface may include, for example, an Advanced Technology Attachment (ATA) adapter, a Serial ATA (SATA) adapter, a Small Computer System Interface (SCSI) adapter, a RAID controller, a SAN adapter, a network adapter, and/or any component providing processor with access to storage device.

Memory area may include, but are not limited to, random access memory (RAM) such as dynamic RAM (DRAM) or static RAM (SRAM), read-only memory (ROM), erasable programmable read-only memory (EPROM), electrically erasable programmable read-only memory (EEPROM), and non-volatile RAM (NVRAM). The above memory types are exemplary only, and are thus not limiting as to the types of memory usable for storage of a computer program.

To control addition of additive into the vessel 228 and, in turn, the crucible 102 (FIG. 1) (and the initial silicon charge or melt 104), the control unit 280 selectively operates the first vibrator 262 or the second vibrator 277 to move first additive or second additive from the first or second container 204, 206, respectively. The first or second additive is continually added to the vessel 228 while the additive sensor 231 measures the amount (e.g., mass, volume or level) of additive in the vessel 228. Once a target additive amount (i.e., set point) is achieved or exceeded, the vibrator 262, 277 that had been powered to move additive is stopped. The control unit sends a signal to the actuator 230 to active the actuator 230 to discharge additive from the vessel 228 into the additive feed tube 214.

Selection of addition of first or second additive into the vessel 228 and the crucible 102 may be selected by an operator or may automated as part of a control system for ingot growth. The first and second additives may be added at different times during the ingot growth cycle. Some additives may be added in more than one batches (e.g., before ingot growth and during ingot growth).

Generally, the first and second additives may be any solid-phase additive which may be metered by a tray and vibrator for addition to the crucible. Suitable additives include various semiconductor dopants (e.g., p-type dopants such as boron, aluminum, germanium, and/or indium and alloys thereof or n-type dopants such as red phosphorus, phosphorus, arsenic, and/or antimony and alloys thereof). In other embodiments, one of the first and second additives are quartz cullets that are added to the melt as buffer members in a continuous Czochralski process. In some embodiments, one of the first and second additives is solid-phase polycrystalline silicon that is added to the crucible 102 (FIG. 1) during ingot growth. In other embodiments, both the first and second additives are additives other than polycrystalline silicon (e.g., dopants or cullets).

The first and/or second additive may generally be added at any point in time of the ingot growth cycle. For example, the first and/or second additive may be added prior to meltdown of the initial charge of solid-phase polycrystalline silicon that was added to the crucible, may be added during meltdown, may be added after meltdown of the charge, or may be added during ingot growth. The ingot growth process may be a batch Czochralski process in which polycrystalline silicon is not added to the melt during ingot growth or a continuous Czochralski process in which polycrystalline silicon is added to the melt (e.g., continuously or intermittently) during ingot growth.

Compared to conventional additive feed systems, the additive feed systems of the present disclosure have several advantages. By using a common vessel in which the first and second additives may be selectively added and measured, the first and second additives may be added to the crucible with relative precision. The quantity of the additive added may be measured, dosed and modulated according to additive parameters associated with ingot growth. Use of vibratory trays allows the respective additive to be reliably moved from its storage container to the vessel in which it is weighed. Use of common components (e.g., weigh vessel, additive feed tube, actuators for discharge of additive, and the like) reduces cost and complexity of the system.

As used herein, the terms "about," "substantially," "essentially" and "approximately" when used in conjunction with ranges of dimensions, concentrations, temperatures or other physical or chemical properties or characteristics is meant to cover variations that may exist in the upper and/or lower limits of the ranges of the properties or characteristics, including, for example, variations resulting from rounding, measurement methodology or other statistical variation.

When introducing elements of the present disclosure or the embodiment(s) thereof, the articles "a", "an", "the" and "said" are intended to mean that there are one or more of the elements. The terms "comprising," "including," "containing" and "having" are intended to be inclusive and mean that there may be additional elements other than the listed elements. The use of terms indicating a particular orientation (e.g., "top", "bottom", "side", etc.) is for convenience of description and does not require any particular orientation of the item described.

As various changes could be made in the above constructions and methods without departing from the scope of the disclosure, it is intended that all matter contained in the above description and shown in the accompanying drawing[s] shall be interpreted as illustrative and not in a limiting sense.

What is claimed is:

1. An additive feed system for feeding at least two different additives to silicon disposed within a crucible, the additive feed system comprising:
   a first canister for holding a first additive;
   a second canister for holding a second additive;
   a vessel for collecting first additive discharged from the first canister and second additive discharged from the second canister;
   an additive sensor for sensing an amount of first additive or second additive in the vessel; and
   an additive feed tube for transporting first additive or second additive from the vessel to the crucible.

2. The additive feed system as set forth in claim 1 comprising an actuator for releasing first additive or second additive from the vessel.

3. The additive feed system as set forth in claim 2 wherein the actuator selectively opens and closes the vessel to release first additive or second additive from the vessel.

4. The additive feed system as set forth in claim 2 further comprising a control unit, the control unit being communicatively coupled to the actuator, the control unit activating the actuator to discharge additive from the vessel into the additive feed tube upon the sensor sensing that the amount of additive in the vessel equals or exceeds a target additive amount.

5. The additive feed system as set forth in claim 4 wherein the control unit selectively controls addition of first additive to the vessel or second additive to the vessel.

6. The additive feed system as set forth in claim 4 comprising:
   a first tray disposed below the first canister for moving first additive from the first canister to the vessel;
   a first vibrator for vibrating the first tray to cause first additive to move along the first tray toward the vessel, the control unit being communicatively coupled to the first vibrator;
   a second tray disposed below the second canister for moving second additive from the second canister to the vessel; and
   a second vibrator for vibrating the second tray to cause second additive to move along the second tray toward the vessel, the control unit being communicatively coupled to the first vibrator.

7. The additive feed system as set forth in claim 1 comprising:
   a first tray disposed below the first canister for moving first additive from the first canister to the vessel;
   a first vibrator for vibrating the first tray to cause first additive to move along the first tray toward the vessel;
   a second tray disposed below the second canister for moving second additive from the second canister to the vessel; and
   a second vibrator for vibrating the second tray to cause second additive to move along the second tray toward the vessel.

8. The additive feed system as set forth in claim 1 wherein the additive sensor senses the level, volume or mass of the additive.

9. The additive feed system as set forth in claim 1 wherein the additive sensor is a load cell.

10. An ingot puller apparatus for preparing a silicon ingot, the ingot puller apparatus comprising:
    a crucible for holding a silicon melt;
    a growth chamber for pulling a silicon ingot from the melt, the crucible being disposed within the crucible;
    an additive feed system for feeding at least two different additives to silicon disposed within the crucible, the additive feed system comprising:
        a first canister for holding a first additive;
        a second canister for holding a second additive;
        a vessel for collecting first additive discharged from the first canister and second additive discharged from the second canister; and
        an additive feed tube for transporting first additive or second additive from the vessel to the crucible.

11. The ingot puller apparatus as set forth in claim 10 wherein the additive feed system comprises an additive sensor for sensing an amount of first additive or second additive in the vessel.

12. The ingot puller apparatus as set forth in claim 11 wherein the additive sensor is a load cell.

13. The ingot puller apparatus as set forth in claim 10 wherein the additive feed system comprises an actuator for releasing first additive or second additive from the vessel.

14. The ingot puller apparatus as set forth in claim 10 comprising:
    a first tray disposed below the first canister for moving first additive from the first canister to the vessel;
    a first vibrator for vibrating the first tray to cause first additive to move along the first tray toward the vessel;
    a second tray disposed below the second canister for moving second additive from the second canister to the vessel; and
    a second vibrator for vibrating the second tray to cause second additive to move along the second tray toward the vessel.

15. A method for forming a single crystal silicon ingot comprising:
    adding solid-phase polycrystalline silicon to a crucible having a sidewall and a bottom;
    heating the polycrystalline silicon to form a silicon melt having a surface;
    contacting the silicon melt with a seed crystal;
    withdrawing the seed crystal from the silicon melt to form a silicon ingot;
    adding a first additive to a vessel;
    weighing an amount of first additive in the vessel;
    adding the first additive to the melt when the amount of first additive in the vessel equals or exceeds a target first additive amount;
    adding a second additive to the vessel;
    weighing an amount of second additive in the vessel; and
    adding the second additive to the melt when the amount of second additive in the vessel equals or exceeds a target second additive amount.

16. The method as set forth in claim 15 wherein the first additive is added before the silicon melt is contacted with the seed crystal.

17. The method as set forth in claim 16 wherein the second additive is added before the silicon melt is contacted with the seed crystal.

18. The method as set forth in claim 15 wherein the ingot is grown in a batch Czochralski process and polycrystalline silicon is not added to the melt during ingot growth.

19. The method as set forth in claim 15 wherein the ingot is grown in a continuous Czochralski process in which polycrystalline silicon is added to the melt during ingot growth.

\* \* \* \* \*

UNITED STATES PATENT AND TRADEMARK OFFICE
CERTIFICATE OF CORRECTION

PATENT NO. : 11,499,245 B2
APPLICATION NO. : 17/138035
DATED : November 15, 2022
INVENTOR(S) : Zardoni et al.

It is certified that error appears in the above-identified patent and that said Letters Patent is hereby corrected as shown below:

In the Claims

Claim 10, Column 9, Line 10:
Delete the phrase "the crucible being disposed within the crucible" and insert -- the crucible being disposed within the growth chamber --

Signed and Sealed this
Twenty-second Day of October, 2024

Katherine Kelly Vidal
*Director of the United States Patent and Trademark Office*